(12) United States Patent
Tamaki et al.

(10) Patent No.: US 11,063,192 B2
(45) Date of Patent: Jul. 13, 2021

(54) LIGHT EMITTING DEVICE WITH PROTECTED FLUORESCENT SUBSTANCE

(71) Applicant: NICHIA CORPORATION, Anan (JP)

(72) Inventors: Hiroto Tamaki, Anan (JP); Yoshiki Sato, Anan (JP); Yoichi Bando, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 15/220,681

(22) Filed: Jul. 27, 2016

(65) Prior Publication Data

US 2017/0033267 A1    Feb. 2, 2017

(30) Foreign Application Priority Data

Jul. 28, 2015   (JP) .............................. JP2015-149061

(51) Int. Cl.
*H01L 33/52*   (2010.01)
*H01L 33/50*   (2010.01)
(Continued)

(52) U.S. Cl.
CPC .............. *H01L 33/52* (2013.01); *H01L 33/46* (2013.01); *H01L 33/50* (2013.01); *H01L 33/502* (2013.01); *H01L 33/505* (2013.01); *H01L 33/508* (2013.01); *H01L 33/60* (2013.01); H01L 33/507 (2013.01); H01L 33/56 (2013.01); H01L 2224/16225 (2013.01); H01L 2224/73253 (2013.01); H01L 2933/005 (2013.01);
(Continued)

(58) Field of Classification Search
CPC ....... H01L 33/52; H01L 33/60; H01L 33/508; H01L 33/505; H01L 33/502; H01L 33/46; H01L 33/50; H01L 2933/0041; H01L 33/507; H01L 2933/0025; H01L 2933/005; H01L 33/56
See application file for complete search history.

(56) References Cited

U.S. PATENT DOCUMENTS

2004/0190304 A1   9/2004  Sugimoto et al.
2006/0175625 A1   8/2006  Yokotani et al.
(Continued)

FOREIGN PATENT DOCUMENTS

CN   203859114 U   10/2014
EP   2216834 A1    8/2010
(Continued)

*Primary Examiner* — Bilkis Jahan
(74) *Attorney, Agent, or Firm* — Hunton Andrews Kurth LLP (57) ABSTRACT

A light emitting device is provided. The light emitting device includes a light emitting element, a wavelength converting member, a light transmissive member, an adhesive member, and a light reflective member. The wavelength converting member has an upper surface and lateral surfaces, contains a fluorescent substance, and is placed on the light emitting element. The light transmissive member covers the upper surface of the wavelength converting member. The adhesive member is interposed between the light emitting element and the wavelength converting member, and covers the lateral surfaces of the wavelength converting member. The light reflective member covers the lateral surfaces of the wavelength converting member via the adhesive member.

14 Claims, 9 Drawing Sheets

(51) Int. Cl.
   *H01L 33/46* (2010.01)
   *H01L 33/60* (2010.01)
   *H01L 33/56* (2010.01)

(52) U.S. Cl.
   CPC ............ *H01L 2933/0025* (2013.01); *H01L 2933/0041* (2013.01)

(56) References Cited

U.S. PATENT DOCUMENTS

| | | | |
|---|---|---|---|
| 2011/0140633 A1* | 6/2011 | Archenhold | F21S 8/026 |
| | | | 315/291 |
| 2011/0254039 A1* | 10/2011 | Kim | H01L 24/97 |
| | | | 257/98 |
| 2011/0303940 A1 | 12/2011 | Lee et al. | |
| 2011/0309398 A1* | 12/2011 | Ito | H01L 33/505 |
| | | | 257/98 |
| 2012/0161162 A1 | 6/2012 | Engl et al. | |
| 2012/0235169 A1* | 9/2012 | Seko | H01L 33/60 |
| | | | 257/88 |
| 2012/0236582 A1* | 9/2012 | Waragaya | H01L 33/507 |
| | | | 362/510 |
| 2013/0001605 A1* | 1/2013 | Ishihara | H01L 33/56 |
| | | | 257/88 |
| 2013/0049054 A1* | 2/2013 | Namiki | H01L 24/06 |
| | | | 257/98 |
| 2013/0193837 A1 | 8/2013 | Ohno et al. | |
| 2013/0300285 A1* | 11/2013 | Ito | H01L 33/46 |
| | | | 313/512 |
| 2014/0146547 A1 | 5/2014 | Tsutsumi et al. | |
| 2014/0226308 A1 | 8/2014 | Fukuda et al. | |
| 2015/0021642 A1 | 1/2015 | Nakabayashi | |
| 2015/0102366 A1 | 4/2015 | Wada | |
| 2015/0162499 A1 | 6/2015 | Sato et al. | |
| 2015/0171290 A1 | 6/2015 | Lee et al. | |
| 2015/0188001 A1 | 7/2015 | Schricker et al. | |
| 2015/0188004 A1 | 7/2015 | Ozeki et al. | |
| 2015/0204494 A1 | 7/2015 | Wada et al. | |
| 2015/0207045 A1 | 7/2015 | Wada et al. | |
| 2015/0262987 A1* | 9/2015 | Wada | H01L 33/46 |
| | | | 257/98 |
| 2015/0263254 A1 | 9/2015 | Miyoshi et al. | |
| 2015/0325757 A1* | 11/2015 | Shuhei | H01L 33/505 |
| | | | 257/98 |
| 2016/0190418 A1* | 6/2016 | Inomata | H01L 33/644 |
| | | | 257/98 |
| 2017/0117442 A1 | 4/2017 | Sato et al. | |
| 2018/0097149 A1 | 4/2018 | Sato et al. | |

FOREIGN PATENT DOCUMENTS

| | | | | |
|---|---|---|---|---|
| EP | 2816621 A1 | | 12/2014 | |
| JP | 2003110146 A | | 4/2003 | |
| JP | 2007-067204 A | | 3/2007 | |
| JP | 2007-123576 A | | 5/2007 | |
| JP | 2010-219324 A | | 9/2010 | |
| JP | 2010-283281 A | | 12/2010 | |
| JP | 2012004567 A | | 1/2012 | |
| JP | 2012-079776 A | | 4/2012 | |
| JP | 2012134355 A | | 7/2012 | |
| JP | 2012516044 A | | 7/2012 | |
| JP | 2012-146942 A | | 8/2012 | |
| JP | 2013038115 A | | 2/2013 | |
| JP | 2013153105 A | | 8/2013 | |
| JP | 2014-072213 A | | 4/2014 | |
| JP | PCT/JP2014/071057 | * | 8/2014 | ............ 33/644 |
| JP | 2014-186882 A | | 10/2014 | |
| JP | 2015-038963 A | | 2/2015 | |
| JP | 2015-079805 A | | 4/2015 | |
| JP | 2015084384 A | | 4/2015 | |
| JP | 2015-099940 A | | 5/2015 | |
| JP | 2015133477 A | | 7/2015 | |
| JP | 2015-522954 A | | 8/2015 | |
| JP | 2015-188069 A | | 10/2015 | |
| WO | 2010083929 A1 | | 7/2010 | |
| WO | 2011-125428 A1 | | 10/2011 | |
| WO | 2013-061511 A1 | | 5/2013 | |
| WO | 2014/072865 A1 | | 5/2014 | |
| WO | 2015/004577 A1 | | 1/2015 | |
| WO | 2015/104623 A1 | | 7/2015 | |

* cited by examiner

LIGHT EMITTING DEVICE WITH PROTECTED FLUORESCENT SUBSTANCE

CROSS-REFERENCE TO RELATED APPLICATION

The present application claims the benefit of Japanese Patent Application No. 2015-149061, filed on Jul. 28, 2015. The entire disclosure of the Japanese Patent Application No. 2015-149061 is incorporated herein.

BACKGROUND

The present disclosure relates to light emitting devices and methods for manufacturing the same.

Japanese Unexamined Patent Application Publication No. 2014-072213, for example, discloses a light emitting device which includes a mounting board, an LED chip mounted on the mounting board, a phosphor layer on the LED chip, and a dam member which has a first layer and a second layer on the first layer surrounding the LED chip. It further discloses that the second layer, which is non-light transmissive, covers the upper surface in the peripheral portion of the phosphor layer.

SUMMARY

A light emitting device according to one embodiment of the present disclosure includes a light emitting element, a wavelength converting member, a light transmissive member, an adhesive member, and a light reflective member. The wavelength converting member has an upper surface and lateral surfaces, contains a fluorescent substance, and is placed on the light emitting element. The light transmissive member covers an upper surface of the wavelength converting member. The adhesive member is interposed between the light emitting element and the wavelength converting member, and covers the lateral surfaces of the wavelength converting member. The light reflective member covers the lateral surfaces of the wavelength converting member via the adhesive member.

A light emitting device according to another embodiment of the disclosure includes at least one light emitting element, a wavelength converting member, a light transmissive member, and a light reflective member. The wavelength converting member has an upper surface and lateral surfaces, contains a fluorescent substance, and is placed on the at least one light emitting element. The light transmissive member continuously covers the upper surface and the lateral surfaces of the wavelength converting member. The light reflective member covers the lateral surfaces of the wavelength converting member via the light transmissive member.

A method of manufacturing a light emitting device according to one embodiment of the disclosure includes: forming a light emitting structure in which a light emitting element is flip chip mounted, a wavelength converting member containing a fluorescent substance, and a light transmissive member are stacked on a wiring board in that order from the light emitting element side; embedding the at least one light emitting structure in a light reflective member; and grinding the light reflective member from the top until the light transmissive member is exposed.

The light emitting device according to a certain embodiment of the present disclosure can reduce the deterioration of the fluorescent substance in the wavelength converting member. Moreover, the method of manufacturing a light emitting device according to a certain embodiment of the disclosure can efficiently mass produce such light emitting devices.

DETAILED DESCRIPTION

Embodiments of the disclosure will be explained below with reference to drawings. However, the light emitting devices and the methods for manufacturing the same described below are given for the purpose of embodying the technical ideas of the present invention, which is not limited to those described unless otherwise specifically noted. Moreover, those described in one embodiment or example are applicable to other embodiments and examples. Furthermore, the sizes and the positional relationships of the components may be exaggerated for clarity of explanations.

In the following explanation, x direction is in a lateral direction, y direction is in a transverse direction, and z direction is in a height (or thickness) direction. Each of the x, y, and z directions (or axes) is a direction (or axis) perpendicular to the other two directions (axes).

Embodiment 1

Figure 1A:
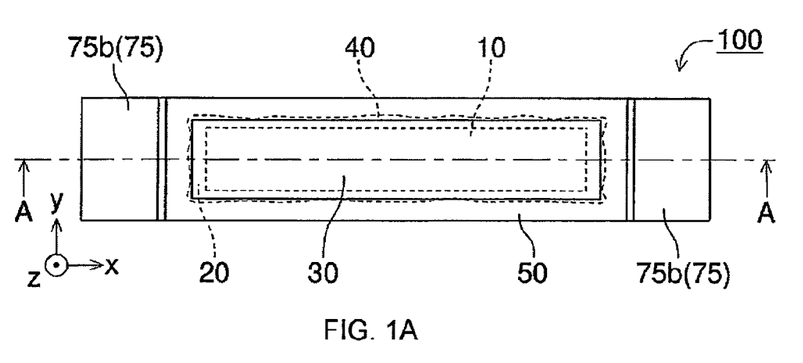
FIG. 1A is a schematic top view of a light emitting device according to a first embodiment.
Figure 1B:
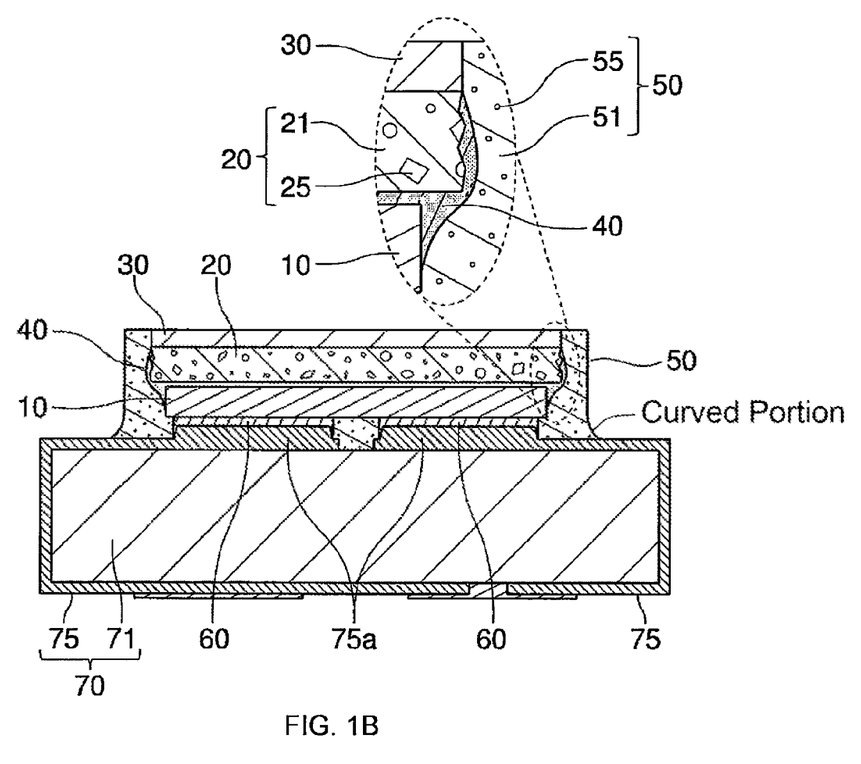
FIG. 1B is a schematic sectional view along line A-A indicated in FIG. 1A.

FIG. 1A is a schematic top view of the light emitting device 100 according to Embodiment 1, and FIG. 1B is a schematic sectional view along line A-A indicated in FIG. 1A. FIG. 1B includes a partially enlarged view of the portion encircled by the dotted line. As shown in FIGS. 1A and 1B, the light emitting device 100 includes a light emitting element 10, a wavelength converting member 20, a light transmissive member 30, an adhesive member 40, and a light reflective member 50.

The wavelength converting member 20 is positioned above the light emitting element 10. The wavelength converting member 20 has an upper surface and lateral surfaces. The wavelength converting member 20 contains a fluorescent substance 25. The light transmissive member 30 covers the upper surface of the wavelength converting member 20. The light transmissive member 30 contains effectively no fluorescent substance. The adhesive member 40 is interposed between the light emitting element 10 and the wavelength converting member 20. The adhesive member 40 covers the lateral surfaces of the wavelength converting member 20. The light reflective member 50 covers the lateral surfaces of the wavelength converting member 20 via the adhesive member 40.

In the light emitting device 100 structured as above, degradation of the fluorescent substance 25 can be reduced by the light transmissive member 30 and the adhesive member 40 which cover the wavelength converting member 20. Moreover, formation of an interface is prevented between the lateral surfaces of the wavelength converting member 20, which tend to be rough due to cutting, and the light reflective member 50 reducing multiple reflections and/or absorption of light which would otherwise result in the vicinity of such an interface, thereby increasing the light extraction efficiency.

The term "to cover" is used in this specification to mean, unless otherwise specifically noted, to include the cases where another member is interposed between two members, in addition to the cases where two members are in contact with one another. It suffices for the light transmissive member 30 to cover at least a portion of the upper surface of the wavelength converting member 20, but it is good, for example, when it covers at least 80%, preferably at least 90%, more preferably substantially all, of the total area of the upper surface of the wavelength converting member 20.

It suffices for the adhesive member 40 to cover some portions of the lateral surfaces of the wavelength converting member 20, but it is good when it covers at least 10%, for example, preferably at least 30%, more preferably at least 50%, of the total area of the lateral surfaces of the wavelength converting member 20.

The phrase "to contain effectively no fluorescent substance" in this specification means not only the case of containing no fluorescent substance, but also the case of containing a fluorescent substance to the extent that would not affect the luminescence chromaticity of the light emitting device.

The light emitting device 100 further includes conductive members 60 and a wiring board 70. The light emitting element 10 is flip chip mounted on the wiring board 70. In other words, the positive and negative electrodes of the light emitting element 10 are placed on wiring 75 of the wiring board 70 via the conductive members 60. However, the conductive members 60 and the wiring board 70 may be omitted. In this case, the light emitting device 100 can be a CSP (i.e., chip size package) type light emitting device.

A preferred embodiment of the light emitting device 100 will be explained below.

As shown in FIG. 1B, the lateral surfaces of the wavelength converting member 20 preferably have irregularities. The lateral surfaces which are the cut end surfaces of the wavelength converting member 20 can easily have irregularities because of the fluorescent substance 25 contained therein. This would easily generate multiple reflections in the vicinities of the interfaces between the lateral surfaces of wavelength converting member 20 and the light reflective member 50. Covering the lateral surfaces of the wavelength converting member 20 with an adhesive member 40 (or a light transmissive member 30 in Embodiments 2 and 3), therefore, is of technological significance.

As shown in FIG. 1B, the lateral surfaces of the adhesive member 40 are preferably smoother than the lateral surfaces of the wavelength converting member 20. This can make the interfaces between the adhesive member 40 and the light reflective member 50 good light reflective surfaces, thereby increasing the light extraction efficiency. In order to achieve such smooth lateral surfaces, the adhesive member 40 preferably contains effectively no fluorescent substance. The term "smooth" herein means a small degree and/or number of irregularities, which can be specified, for example, by an average arithmetic roughness Ra.

As shown in FIG. 1B, the lateral surfaces of the light transmissive member 30 are preferably smoother than the lateral surfaces of the wavelength converting member 20. The lateral surfaces, the cut end surfaces of the light transmissive member 30, which contains no fluorescent substance, can relatively easily be formed smooth. This can make the interfaces between the light transmissive member 30 and the light reflective member 50 good light reflective surfaces, thereby increasing the light extraction efficiency.

The fluorescent substance 25 preferably includes at least a fluoride phosphor and/or quantum dots. Although fluoride phosphors and quantum dots have suitable characteristics for backlight devices for liquid crystal displays, such as narrow spectral line widths, they have poor water resistance. Protecting the fluorescent substance 25 thus is of technological significance.

The wavelength converting member 20 is preferably a cured resin containing the fluorescent substance 25. Although resin materials have superior mass productivity at relatively low cost, they are inferior to inorganic materials, such as glass, in terms of gas (including steam) barrier properties and heat resistance. Protecting the fluorescent substance 25, therefore, is of technological significance.

As shown in FIGS. 1A and 1B, the wavelength converting member 20 is preferably of a size that entirely covers the light emitting element 10 in a top view. This promotes an increase in the emission area of the light emitting device, and thus increases the light extraction efficiency. As shown in FIG. 1B, the light reflective member 50 preferably covers the lateral surfaces of the light emitting element 10, more specifically covers them directly and/or indirectly via the adhesive member 40. This increases the front luminance of the light emitting device, as well as reducing the size of the light emitting device.

Figure 2:
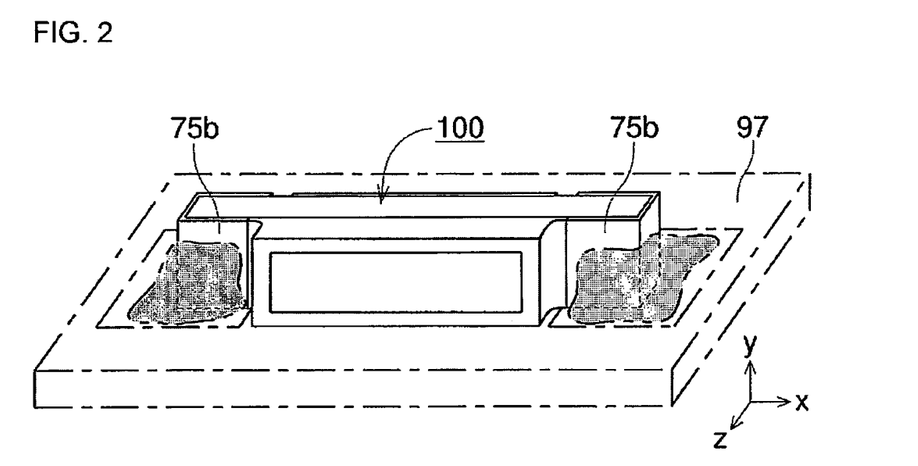
FIG. 2 is a schematic perspective view showing one example of a mounting condition of the light emitting device according to the first embodiment.

FIG. 2 is a schematic perspective view showing an example of mounting condition for the light emitting device 100 according to Embodiment 1. As shown in FIG. 2, the light emitting device 100 is mounted by bonding the terminals 75b to the lands of the mounting board 97 using solder or the like. The light emitting device 100, is preferably used as a side emitting (or side view) type light emitting device. In this case, the mounting surface of the light emitting device 100 would be substantially perpendicular to the upper surface of the light transmissive member 30. A side view type light emitting device is formed thin and compact to be utilized as a backlight device for a liquid crystal display of, for example, a cell phone. In this case, the emission surface of the light emitting device is abutted against a lateral surface of the light guide plate, but the fluorescent substance 25 can be protected by covering the upper surface of the wavelength converting member 20 with the light transmissive member 30. When the plan view shape of the light emitting device 100 is quadrangular with each side being 0.5 mm or less, in particular, the mechanical strength of the light emitting device 100 tends to be reduced which in turn reduces the mechanical strength of the wavelength converting member 20. Protecting the fluorescent substance 25 thus is of technological significance. For the light emitting device 100, a top emitting (or top view) type light emitting device can also be employed.

Figure 3A:
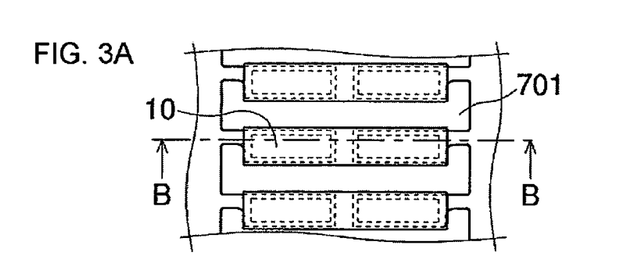
FIGS. 3A-3E are schematic top views explaining one example of a method of manufacturing the light emitting device according to the first embodiment.
Figure 3B:
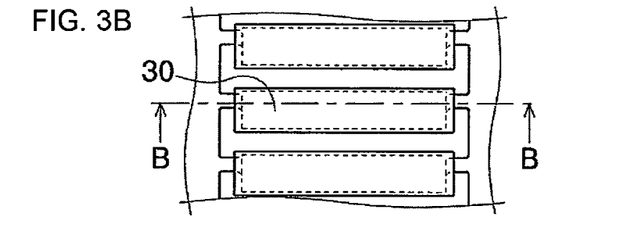
Figure 3C:
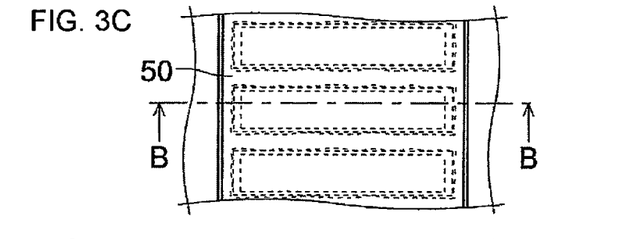
Figure 3D:
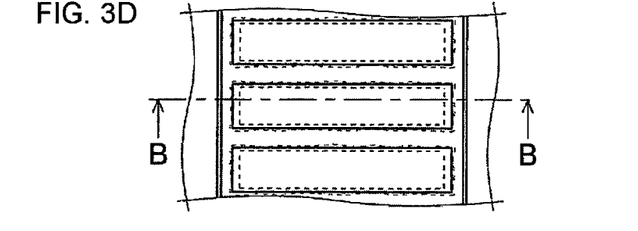
Figure 3E:
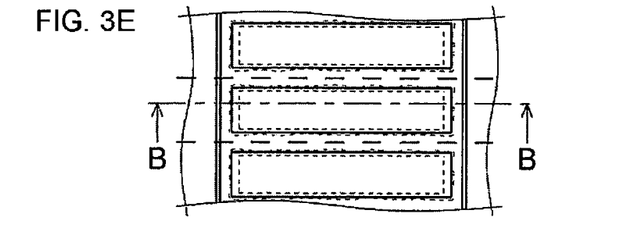
Figure 4A:
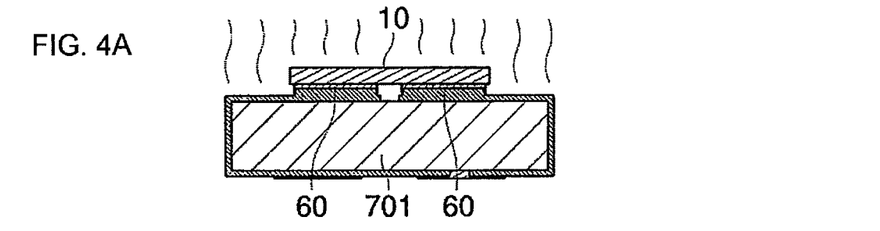
FIGS. 4A-4E are schematic sectional views along line B-B respectively indicated in FIGS. 3A-3E.
Figure 4B:
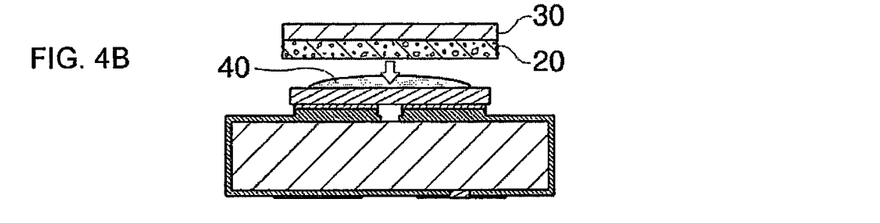
Figure 4C:
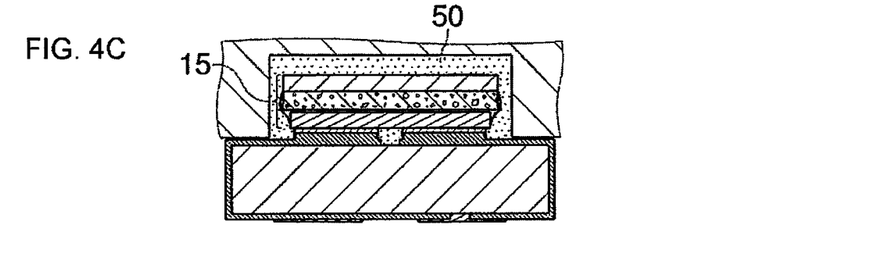
Figure 4D:
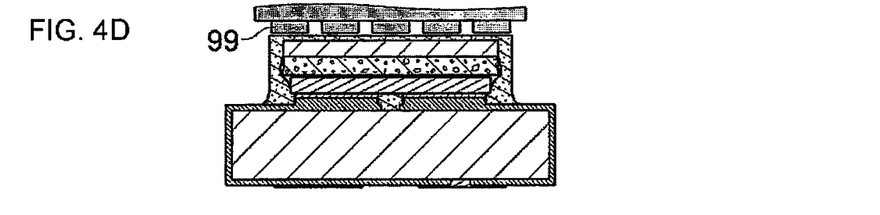

FIGS. 3A-3E are schematic top views explaining one example of the method of manufacturing the light emitting device 100 according to Embodiment 1, and FIGS. 4A-4E are schematic sectional views along line B-B respectively indicated in FIGS. 3A-3E. The method of manufacturing the light emitting device 100 includes: forming a light emitting structure 15 in which a light emitting element 10 is flip chip mounted, a wavelength converting member 20 containing a fluorescent substance, and a light transmissive member 30 containing effectively no fluorescent substance are stacked on a wiring board 70 in that order as shown in FIGS. 3A, 3B, 4A, and 4B; embedding the light emitting structure 15 in a light reflective member 50 as shown in FIGS. 3C and 4C; and grinding the light reflective member 50 from the top until the light transmissive member 30 is exposed as shown in FIGS. 3D, 3E, 4D, and 4E. The light emitting structure 15 may include an adhesive member 40 between the light emitting element 10 and the wavelength converting member 20.

More specifically, the light emitting element 10 can be flip chip mounted on element mounting portions 75a of the wiring board 70 via the conductive members 60 by reflowing, ultrasonic bonding, thermocompression bonding, or the like. The light emitting element 10 and the wavelength converting member 20 can be adhered by placing a liquid state adhesive member 40 between the light emitting element 10 and the wavelength converting member 20, followed by curing the adhesive member 40 by heating or the like. At this point, the adhesive member 40 may be applied to the upper surface of the light emitting element 10 or the lower surface of the wavelength converting member 20. The light emitting element 10 and the wavelength converting member 20 may be directly adhered or bonded together without interposing the adhesive member 40. The light reflective member 50 can be formed by potting, transfer molding, compression molding, or the like. It is preferable to use a grinder 99 for grinding the light reflective member 50.

The method of manufacturing the light emitting device 100 described above can efficiently mass produce the light emitting devices in which the degradation of the fluorescent substance 25 in the wavelength converting member 20 is less likely to occur. Because the light transmissive member 30 covers the upper surface of the wavelength converting member 20, the deterioration of the fluorescent substance 25 due to grinding can be prevented or avoided when grinding the light reflective member 50. Moreover, variety in luminance chromaticity of the light emitting device can be reduced by grinding the light transmissive member 30 instead of grinding the wavelength converting member 20 which contains the fluorescent substance 25.

Here, on composite boards 701 having a linked wiring boards 70, a plurality of light emitting structures 15 are formed in a first direction (i.e., y direction). Then the plurality of light emitting structures 15 are embedded in a single light reflective member 50 followed by cutting the light reflective member 50 and the composite boards 701 between the light emitting structures 15 in a second direction (i.e., x direction), which is perpendicular to the first direction as shown in FIGS. 3A-3E. This can improve the mass productivity of the light emitting devices 100.

In the case where the light emitting structure 15 includes an adhesive member 40, it is preferable to extend the adhesive member 40 onto the lateral surfaces of the wavelength converting member 20. This allows for the adhesive member 40 to cover the lateral surfaces of the wavelength converting member 20, and allows for the light reflective member 50 to cover the lateral surfaces of the wavelength converting member 20 via the adhesive member 40.

As shown in FIGS. 3A, 3B, 4A, and 4B, the light emitting structure 15 is preferably formed by adhering the wavelength converting member 20 and the light transmissive member 30 on the light emitting element 10 after flip chip mounting the light emitting element 10 on the wiring board 70. This can prevent the heating and/or pressure treatment applied during mounting of the light emitting element 10 from affecting the wavelength converting member 20, and in turn the fluorescent substance 25, thereby reducing the deterioration of the fluorescent substance 25.

The light emitting structure 15 may be formed by adhering the wavelength converting member 20 and the light transmissive member 30 on the light emitting element 10 and then flip chip mounting the light emitting element 10 on the wiring board 70. In this case, the relative positioning accuracy between the light emitting element 10 and the wavelength converting member 20 can be increased.

Figure 5A:
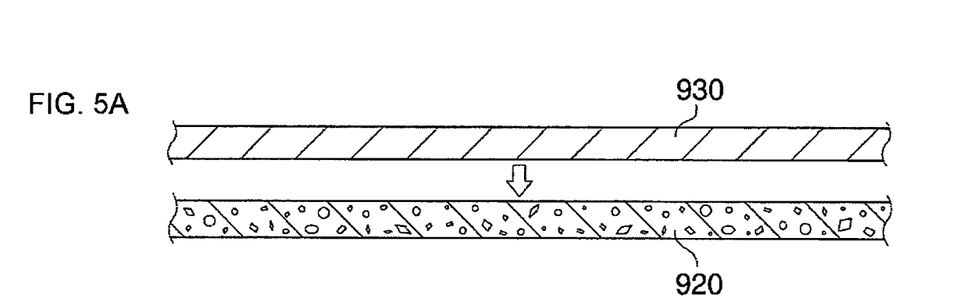
FIGS. 5A-5C are schematic sectional views explaining one example of manufacturing a wavelength converting member and a light transmissive member in the light emitting device according to the first embodiment.
Figure 5B:
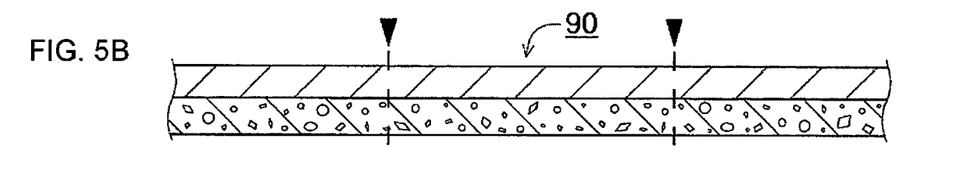
Figure 5C:
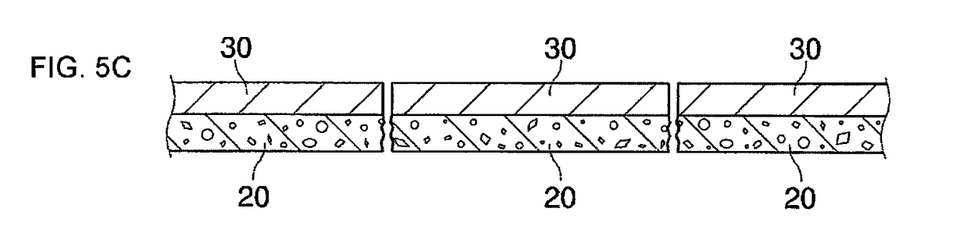

FIGS. 5A-5C are schematic sectional views explaining one example of the method of manufacturing the wavelength converting member 20 and the light transmissive member 30 as used in the light emitting device 100 according to Embodiment 1. As shown in FIG. 5A, the wavelength converting member 20 and the light transmissive member 30 in the light emitting device 100 according to Embodiment 1 can be prepared as described below. First, as shown in FIG. 5A, a thin sheet 920 of a resin, which contains a fluorescent substance, and a thin sheet 930 of a resin, which contains effectively no fluorescent substance, are layered to form a stacked sheet 90. Then, as shown in FIG. 5B, the stacked sheet 90 is cut. In this way, as shown in FIG. 5C, stacks of the wavelength converting member 20 and the light transmissive member 30 covering the upper surface thereof can be obtained. As in the case of Embodiment 3, for example, the stacked sheet 90 can have multiple layers of three or more.

FIGS. 6A-6D are schematic sectional views showing variations of the wavelength converting member 20 and the light transmissive member 30 in the light emitting device 100 according to Embodiment 1.

Figure 6A:
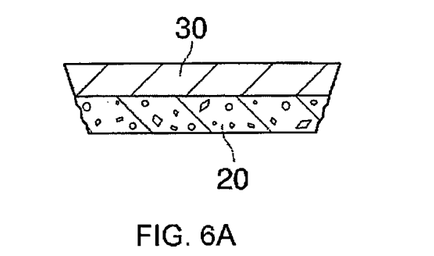
FIGS. 6A-6D are schematic sectional views explaining variations of the wavelength converting member and the light transmissive member in the light emitting device according to the first embodiment.
Figure 6B:
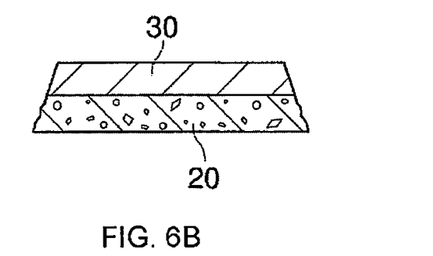

As shown in FIGS. 6A and 6B, the lateral surfaces of the stack of the wavelength converting member 20 and the light transmissive member 30 may be oblique. Particularly, the lateral surfaces of the stack of the wavelength converting member 20 and the light transmissive member 30 shown in FIG. 6A are oblique so that a span of the upper surface on the light transmissive member 30 side is larger than a span of the lower surface on the wavelength converting member 20 side. In this case, it is easier to cover the lateral surfaces of the wavelength converting member 20 with an adhesive member 40, promoting a reduction in the deterioration of the fluorescent substance 25, as well as an increase of the light extraction efficiently. The lateral surfaces of the stack of the wavelength converting member 20 and the light transmissive member 30 shown in FIG. 6B are oblique so that a span of the lower surface on the wavelength converting member 20 side is larger than a span of the upper surface on the light transmissive member 30 side. This reduces the chances of the wavelength converting member 20 and the light transmissive member 30 separating from the light emitting device 100.

Figure 6C:
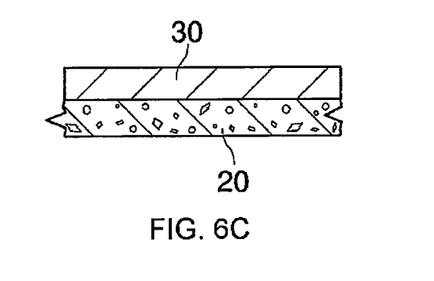

As shown in FIG. 6C, the lateral surfaces of the wavelength converting member 20 may have a protrusion and/or a depression. This reduces the chances of the wavelength converting member 20 separating from the light emitting device 100 as the adhesive member 40 can be locked onto the protrusion or fill the depression.

Figure 6D:
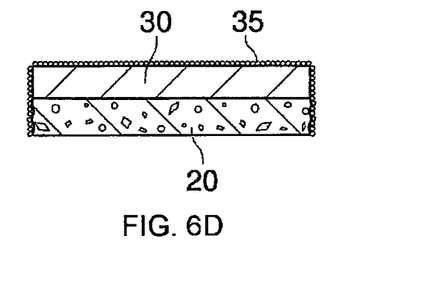

As shown in FIG. 6D, a coating 35 may be formed on the lateral surfaces of the stack of the wavelength converting member 20 and the light transmissive member 30. The coating 35, from the perspective of increasing the light extraction efficiency, preferably has light reflectance, and is particularly preferably made of titanium oxide. The film thickness of the coating 35 is not particularly limited, but is set in a range between 10 nm and 10 µm, for example, preferably in a range between 30 nm and 5 µm, more preferably in a range between 50 nm and 1 µm. The coating 35 may be a thin film composed of particles. The particles are preferably nanoparticles having a primary particle size in a range between 1 nm and 100 nm as defined by, for example, $D_{50}$. Such a coating 35 can be formed by dipping the stack of the wavelength converting member 20 and the light transmissive member 30 in a slurry of particle-dispersed organic solvent, which is preferably volatile, or applying the slurry to the stack of the wavelength converting member 20 and the light transmissive member 30 by potting, ink-jetting, spraying, brushing, sponging, or the like. In the example shown in the drawing, the coating 35 is also formed on the upper surface of the light transmissive member 30, but the coating 35 on the upper surface of the light transmissive member 30 will be removed during the grinding of the light reflective member 50.

Embodiment 2

Figure 7A:
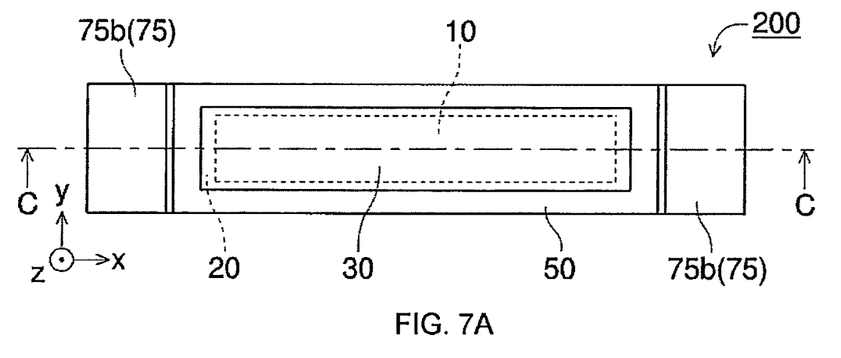
FIG. 7A is a schematic top view of a light emitting device according to a second embodiment.
Figure 7B:
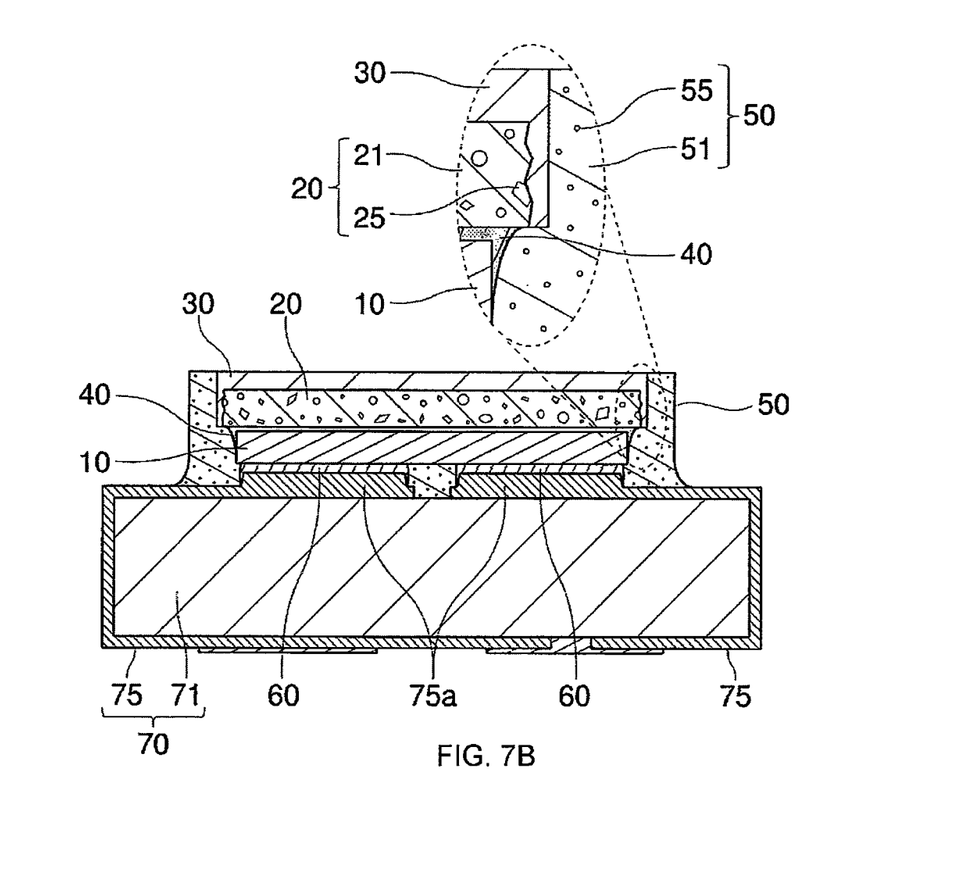
FIG. 7B is a schematic sectional view along line C-C indicated in FIG. 7A.

FIG. 7A is a schematic top view of the light emitting device 200 according to Embodiment 2, and FIG. 7B is a schematic sectional view along line C-C indicated in FIG. 7A. FIG. 7B includes a partially enlarged view of the portion encircled by a dotted line. The light emitting device 200 differs from the light emitting device 100 of Embodiment 1 in terms of the forms of the light transmissive member 30 and the adhesive member 40. Since it is otherwise substantially similar to the light emitting device 100 of Embodiment 1, explanations will be appropriately omitted.

As shown in FIGS. 7A and 7B, the light emitting device 200 includes a light emitting element 10, a wavelength converting member 20, a light transmissive member 30, an adhesive member 40, and a light reflective member 50. The wavelength converting member 20 is placed on the light emitting element 10. The wavelength converting member 20 has an upper surface and lateral surfaces. The wavelength converting member 20 contains a fluorescent substance 25. The light transmissive member 30 continuously covers the upper surface and the lateral surfaces of the wavelength converting member 20. The light transmissive member 30 contains effectively no fluorescent substance. The adhesive member 40 is interposed between the light emitting element 10 and the wavelength converting member 20. The light reflective member 50 covers the lateral surfaces of the wavelength converting member 20 via the light transmissive member 30. The light emitting device 200 also further includes conductive members 60 and a wiring board 70. In the light emitting device 200, the adhesive member 40 may be omitted.

In the light emitting device 200 structured as above, deterioration of the fluorescent substance 25 can be reduced by the light transmissive member 30 which covers the wavelength converting member 20. Moreover, formation of an interface is less likely to occur between the lateral surfaces of the wavelength converting member 20, which tend to be rough due to cutting, and the light reflective member 50. This reduces multiple reflections and/or absorption of light which would otherwise result in the vicinity of such an interface, thereby increasing the light extraction efficiency.

In the example shown in the drawing, the adhesive member 40 is present on the inner side of the lateral surfaces of the wavelength converting member 20. In other words, the adhesive member 40 does not extend onto the lower surface or the lateral surfaces of the light transmissive member 30. This can reduce the light from the light emitting element 10 that is being directly emitted from the edges of the light transmissive member 30 through the adhesive member 40 without passing through the wavelength converting member 20. On the other hand, it is preferable from the perspective of the mass productivity of the light emitting device 200 to have the adhesive member 40 be present on the outer side of the lateral surfaces of the wavelength converting member 20, i.e., extending onto the lower surface or the lateral surfaces of the light transmissive member 30.

Figure 8A:
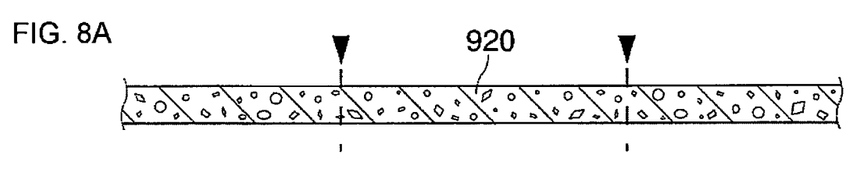
FIGS. 8A-8D are schematic sectional views explaining one example of a method of manufacturing a wavelength converting member and a light transmissive member in the light emitting device according to the second embodiment.
Figure 8B:
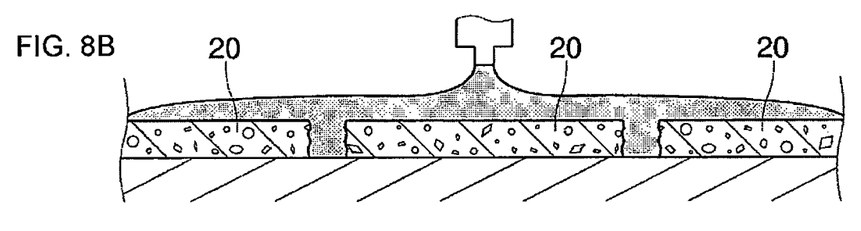
Figure 8C:
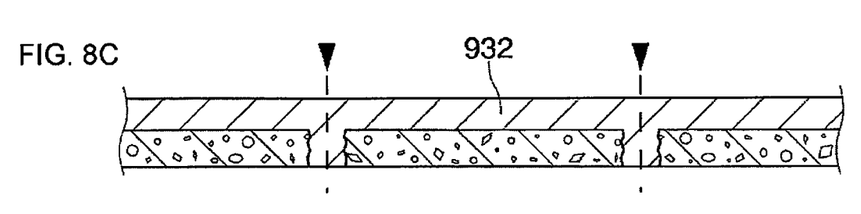
Figure 8D:
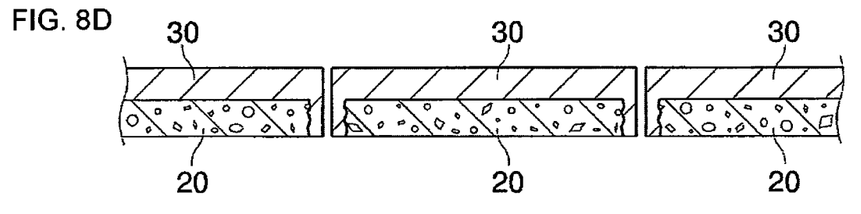

FIGS. 8A-8D are schematic sectional views explaining one example of the method of manufacturing the wavelength converting member 20 and the light transmissive member 30 used in the light emitting device 200 according to Embodiment 2. The wavelength converting member 20 and the light transmissive member 30, as shown in FIG. 8A-8D, can be prepared as described below. First, as shown in FIG. 8A, a thin sheet 920 being a resin containing a fluorescent substance is cut into plural pieces of wavelength converting members 20. Next, as shown in FIG. 8B, the plural pieces are arranged in a row so as to be separated from one another, and the areas above and a space between the separated pieces are filled with a resin 932 containing effectively no fluorescent substance. Finally, as shown in FIG. 8C, the resin 932 is cut in the separation areas between the pieces. At this time, the blade used to cut the resin 932 is preferably spaced apart from the lateral surface of at least one piece of wavelength converting member 20, and the width of the blade for cutting the resin 932 is preferably smaller than the width of the separation area between the pieces. In this way, as shown in FIG. 8D, stacks of the wavelength converting members 20 and the light transmitting members 30 continuously covering the upper surface and the lateral surfaces of the wavelength converting member 20 are obtained.

Embodiment 3

Figure 9A:
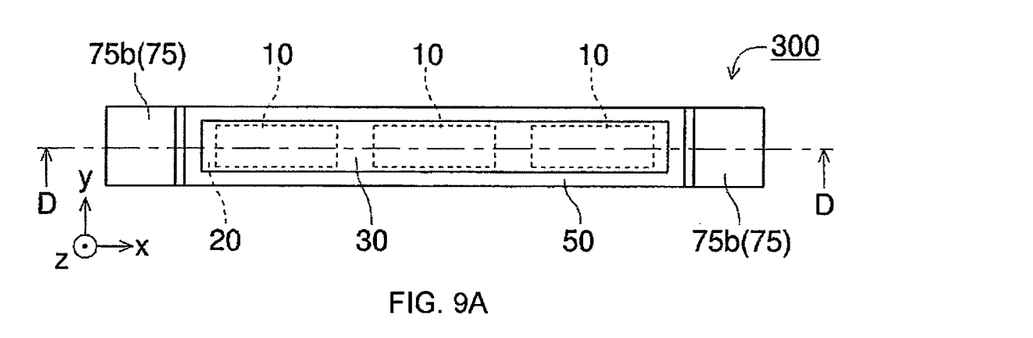
FIG. 9A is a schematic top view of a light emitting device according to a third embodiment.
Figure 9B:
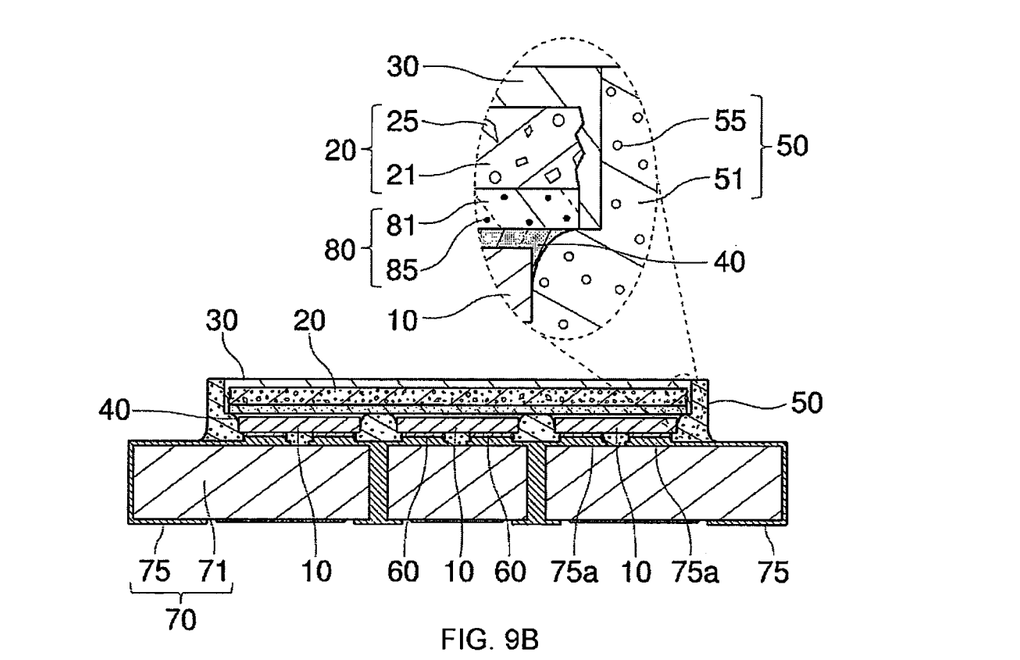
FIG. 9B is a schematic sectional view along line D-D indicated in FIG. 9A.

FIG. 9A is a schematic top view of the light emitting device 300 according to Embodiment 3, and FIG. 9B is a schematic sectional view along line D-D indicated in FIG. 9A. FIG. 9B includes a partially enlarged view of the portion encircled by the dotted line. The light emitting device 300 is different from the light emitting device 200 of Embodiment 2 in terms of the number of light emitting elements 10 and the inclusion of a light diffusing member 80. Since it is otherwise substantially similar to the light emitting device 200 of Embodiment 2, explanations will be appropriately omitted.

As shown in FIGS. 9A and 9B, the light emitting device 300 includes a light emitting element 10, a wavelength converting member 20, a light transmissive member 30, an adhesive member 40, a light reflective member 50, and a light diffusing member 80. It has a plurality of light emitting elements 10. The wavelength converting member 20 is placed on the light emitting elements 10. The wavelength converting member 20 has an upper surface and lateral surfaces. The wavelength converting member 20 contains a fluorescent substance 25. The light diffusing member 80 is placed between the light emitting elements 10 and the wavelength converting member 20. The light diffusing member 80 contains a light diffusion agent 85. The light diffusing member 80 contains effectively no fluorescent substance. The light transmissive member 30 continuously covers the upper surface and the lateral surfaces of the wavelength converting member 20. The light transmissive member 30 also covers the lateral surfaces of the light diffusing member 80. The light transmissive member 30 contains effectively no fluorescent substance. The adhesive member 40 is placed between the light emitting elements 10 and the light diffusing member 80. The light reflective member 50 covers the lateral surfaces of the wavelength converting member 20 via the light transmissive member 30. The light reflective member 50 also covers the lateral surfaces of the light diffusing member 80 via the light transmissive member 30. In the light emitting device 300, the adhesive member 40 may be omitted. The light emitting device 300 also further includes conductive members 60 and a wiring board 70. The plurality of light emitting elements 10 are serially connected by the wiring 75 of the wiring board 70.

In the light emitting device 300 constructed as above, deterioration of the fluorescent substance 25 can be reduced by the light transmissive member 30 that covers the wavelength converting member 20. Since the lower surface of the wavelength converting member 20 is covered by the light diffusing member 80 in addition to the upper and lateral surfaces being covered by the light transmissive member 30, in particular, deterioration of the fluorescent substance 25 can be even further reduced. Moreover, formation of an interface between the lateral surfaces of the wavelength converting member 20, which tend to be rough due to cutting, and the light reflective member 50 is prevented to reduce multiple reflections and/or absorption of light which would otherwise result in the vicinity of such an interface, thereby increasing the light extraction efficiency. Moreover, the light from the plurality of light emitting elements 10 can be diffused by the light diffusing member 80 to be incident on the wavelength converting member 20, thereby reducing irregularities in the luminance distribution and chromaticity distribution at the emission surface. This can make the light emitting device 300 a large-length linear light source or a large-area planar light source capable of emitting light of in-plane uniformity.

Each constituent element of the light emitting devices according certain embodiments of the disclosure will be explained below.

Light Emitting Element 10

The light emitting element includes at least a semiconductor element structure, and in many cases further includes a substrate. For example, the light emitting element may be a light emitting diode (LED) chip. The top view shape of the light emitting element is preferably a quadrangle, particularly a square or a rectangle, but can be other shapes. A hexagon, for example, can also increase the emission efficiency. The lateral surfaces of the light emitting element, primarily those of the substrate, may be perpendicular to the upper surface, or inwardly or outwardly inclined. The light emitting element preferably has positive and negative electrodes on the same surface, but may have a counter electrode structure having the positive electrode on one surface and the negative electrode on the opposing surface. The number of light emitting elements installed in one light emitting device can be single or plural. Plural light emitting elements can be connected in series or parallel. The semiconductor element structure is a semiconductor stack, i.e., includes at least an n-type semiconductor layer and a p-type semiconductor layer, and preferably an active layer interposed therebetween. The semiconductor element structure may include positive and negative electrodes and/or an insulating film. The positive and negative electrodes can be structured with gold, silver, tin, platinum, rhodium, titanium, aluminum, tungsten, palladium, nickel, or an alloy of these. The insulating film can be formed of an oxide or nitride of at least one element selected from among the group consisting of silicon, titanium, zirconium, niobium, tantalum, and aluminum. The wavelength of the light emitted from the light emitting element can be selected from the ultraviolet region to the infrared region by varying the semiconductor materials and the mixed crystal ratio. For the semiconductor materials, it is preferable to use a nitride semiconductor primarily expressed by a general formula, $In_xAl_yGa_{1-x-y}N$, $0 \leq x$, $0 \leq y$, $x+y \leq 1$, which can emit light of a short wavelength to efficiently excite a fluorescent substance. The wavelength of the light emitted by the light emitting element, from the perspective of emission efficiency, as well as excitation of, and mixing color with the light emitted by, a fluorescent substance, is preferably in a range between 400 nm and 530 nm, more preferably in a range between 420 nm and 490 nm, and even more preferably in a range between 450 nm and 475 nm. In addition, an InAlGaAs-based semiconductor, InAlGaP-based semiconductor, zinc sulfide, zinc selenide, silicon carbide, or the like, may also be used. The substrate for the light emitting element is primarily a crystal growth substrate on which semiconductor crystals can grow to configure the semiconductor element structure, but may be a substrate for joining with a semiconductor element structure, which has been separated from a substrate for crystal growth. A light transmittive substrate facilitates the employment of flip chip mounting, as well as increasing the light extraction efficiency. Examples of the base material for the substrate include sapphire, spinel, gallium nitride, aluminum nitride, silicon, silicon carbide, gallium arsenide, gallium phosphide, indium phosphide, zinc sulfide, zinc oxide, zinc selenide, and diamond. Among all, sapphire is preferable. The thickness of the substrate, for example, is in a range between 0.02 mm and 1 mm, and from the perspective of the strength of the substrate and the thickness of the light emitting device, the thickness is preferably in a range between 0.05 mm and 0.3 mm.

Wavelength Converting Member 20

Base Material 21

The base material for the wavelength converting member can be selected from materials having a light transmittance, for example at least 50%, preferably at least 70%, more preferably at least 85%, of the light emitted from the light emitting element. For the base material for the wavelength converting member, silicone resins, epoxy resins, phenol resins, polycarbonate resins, acrylic resins, or modified or hybrid resins of these can be used. Among all, silicone resins or their modified or hybrid resins are preferable as they generally are highly heat resistant and light resistant. Glass may also be used. The wavelength converting member can be structured as a single layer of one of these base materials, or a multilayer of two or more of these base materials. In addition, for the wavelength converting member, a sintered body of a phosphor and inorganic material, such as alumina, or a plate-like phosphor crystal sheet may also be used. The light extraction efficiency can also be increased by setting the refractive index of the base material of the wavelength converting member higher than the refractive index of the light transmissive member and especially of the base material of the light transmissive member.

Fluorescent Substance 25

The fluorescent substance absorbs at least one portion of a primary light emitted from the light emitting element, and emits a secondary light having a different wavelength than that of the primary light. This allows for the light emitting device to emit a visible wavelength mixed color light, such as white light, mixing the primary light and the secondary light. For the fluorescent substance, one of the specific examples listed below can be used singly, or two or more in combination. Specific examples of the fluorescent substance include yttrium aluminum garnet based phosphors, such as $Y_3(Al,Ga)_5O_{12}$:Ce, lutetium aluminum garnet based phosphors, such as $Lu_3(Al,Ga)_5O_{12}$:Ce, silicate based phosphors, such as $(Ba,Sr)_2SiO_4$:Eu, chlorosilicate based phosphors, such as $Ca_8Mg(SiO_4)_4Cl_2$: Eu, β-SiAlON based phosphors, such as $Si_{6-z}Al_zO_zN_{8-z}$:Eu (0<Z<4.2), nitrogen-containing calcium aluminosilicate (CASN or SCASN) based phosphors, such as (Sr,Ca)AlSiN$_3$:Eu, and potassium fluorosilicate based phosphors, such as $K_2SiF_6$:Mn. In addition, the fluorescent substance may contain quantum dots. Quantum dots are particles in a range of about 1 nm to 100 nm in size, and can alter the wavelength of light by the particle size. Examples of quantum dots include cadmium selenide, cadmium telluride, zinc sulfide, cadmium sulfide, lead sulfide, lead selenide, $AgInS_2$, $AgZnInS_x$, and $CuInS_2$. Quantum dots may be sealed in spherical glass or a light transmissive inorganic compound. In certain embodiments of the present disclosure, it is good such that among these fluorescent substances, those that are relatively vulnerable to moisture and oxygen in the atmosphere can be employed.

Light Transmissive Member 30

The light transmissive member may be of any material having a light transmittance, for example at least 50%, preferably at least 70%, more preferably at least 85%, of the light emitted from the LED chip. For the light transmissive member, silicone resins, epoxy resins, phenol resins, polycarbonate resins, acrylic resins, or their modified or hybrid resins can be used. Among all, silicone resins or their modified or hybrid resins are preferable as they are generally highly heat resistant and light resistant. Glass can also be used. The light transmissive member can be structured as a single layer of one of these base materials, or multilayer of two or more of these base materials. Moreover, the light transmissive member may contain a light diffusion agent, and the content preferably is within the range that can maintain the smoothness of the surface.

Coating 35

The coating can be structured with the same material to the white pigment and the light diffusion agent described below. The coating can be formed with a high density particle aggregation.

Adhesive Member 40

Examples of the base material for the adhesive member include silicone resins, epoxy resins, phenol resins, polycarbonate resins, acrylic resins, or their modified or hybrid resins. Among all, silicone resins or their modified or hybrid resins are preferable as they are generally highly heat resistant and light resistant.

Light Reflective member 50

Base Material 51

Examples of the base material for the light reflective member include silicone resins, epoxy resins, phenol resins, polycarbonate resins, acrylic resins, or their modified or hybrid resins. Among all, silicone resins or their modified or hybrid resins are preferable as they are generally highly heat resistant and light resistant. The light reflective member preferably contains white pigments in the base material.

White Pigments 55

For the white pigments, one of the following or two or more in combination can be used: titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. The shape of the white pigments is not particularly limited, and can be in an irregular or crushed form, but is preferably spherical from the perspective of fluidity. The primary particle size of the white pigments as defined, for example, by $D_{50}$, is, for example, in a range of about 0.1 μm and 0.5 μm, but the smaller the size is, the more effective the reflection and the coverage become. The content of white pigments in the light reflective member is not particularly limited, but from the perspective of reflectivity and viscosity in a fluid state, it is preferably in a range between 10 wt % and 70 wt %, more preferably in a range between 30 wt % and 60 wt %. The "wt %," weight percent, represents the ratio of the material to the total weight of the light reflective member.

Conductive Members 60

For the conductive members, one of the following can be used: bumps made of gold, silver, copper or the like; a metal paste made of a resin binder and metal powder, such as silver, gold, copper, platinum, aluminum, palladium or the like; tin-bismuth based, tin-copper based, tin-silver based, or gold-tin based solder; and low melting point brazing filler metals or the like.

Wiring board 70

Base 71

In the case of employing a rigid, resins, including fiber reinforced resins, ceramics, glass, metals, paper, or the like, can be used. Examples of resins include epoxy, glass epoxy, bismaleimide-triazine (BT), and polyimide. Examples of ceramics include aluminum oxide, aluminum nitride, zirconium oxide, zirconium nitride, titanium oxide, titanium nitride, or a mixture thereof. Examples of metals include copper, iron, nickel, chromium, aluminum, silver, gold, titanium, and their alloys. In the case of employing a flexible board, polyimide, polyethylene terephthalate, polyethylene naphthalate, liquid crystal polymer, cyclo-olefin polymer, or the like, can be used. Among these base materials, particularly those having similar linear expansion coefficient to that of the light emitting element are preferably used.

Wiring 75

The wiring is formed at least on the upper surface of the base, and may also be formed inside and/or on the lateral surfaces and/or the lower surface of the base. The wiring preferably has element mounting portions on which a light emitting element is mounted, terminals for external connection, and lead-out wiring portions connecting these. The wiring can be formed with copper, iron, nickel, tungsten, chromium, aluminum, silver, gold, titanium, palladium, rhodium, or an alloy of these. The wiring may be a single layer or a multilayer of these metals or alloys. From the perspective of heat dissipation, in particular, copper or copper alloys are preferable. From the perspective of wettability of the bonding member and/or reflectivity, a layer of silver, platinum, aluminum, rhodium, gold, or an alloy of these may be disposed as the outermost layer of the wiring.

Light Diffusing member 80

Base Material 81

The base material for the light diffusing member may be any material having a light transmittance, for example at least 50%, preferably at least 70%, more preferably at least 85%, of the light emitted from the light emitting element. For the base material for the light diffusing member, silicone resins, epoxy resins, phenol resins, polycarbonate resins, acrylic resins, or their modified or hybrid resins can be used. Among all, silicone resins or their modified or hybrid resins are preferable as they are generally highly heat resistant and light resistant. Glass can also be used. The light diffusing member can be structured as a single layer of one of these base materials, or multilayer of two or more of these base materials.

Light Diffusion Agent 85

For the light diffusion agent, inorganic particles of barium titanate, titanium oxide, aluminum oxide, silicon oxide, calcium carbonate, or the like, organic particles of silicone resins, acrylic resins, or the like, can be used. For the light diffusion agent, glass powder, preferably refractive index adjusted glass powder, may also be used. For the light diffusion agent, one of these can be used singly, or two or more in combination.

EXAMPLE

One example of the disclosure will be explained in detail below. It goes without saying that the present disclosure is not limited to the example described below.

Example 1

The light emitting device according to Example 1 is a side emitting LED device having dimensions of 1.8 mm in longitudinal, 0.32 mm in lateral, and 0.70 mm in thickness, having the structure of the light emitting device 100 shown in FIGS. 1A and 1B.

The wiring board 70 having dimensions of 1.8 mm in longitudinal, 0.32 mm in lateral, and 0.36 mm in thickness, includes a base 71 and a pair of wiring 75 aligned in the lateral direction on the base 71. The base 71 is a rectangular parallelepiped made of a BT resin, for example, HL832NSF type LCA manufactured by Mitsubishi Gas Chemical Company, Inc. The pair of wiring 75 is composed of layers of copper/nickel/gold from the base 71 side. The pair of wiring 75 each includes one or more element mounting portions 75a, including a 40 μm thick protrusion of the copper layer, formed on the upper surface of the base 71 towards the center in a lateral direction, and a terminal 75b formed from the end portion of the upper surface in the lateral direction via the lateral surface to the lower surface of the base 71.

A light emitting element 10 is flip chip mounted on the element mounting portions 75a of the pair of wiring via the conductive members 60. The light emitting element 10 is a rectangular parallelepiped LED chip having dimensions of 1.1 mm in a longitudinal direction, 0.2 mm in a lateral direction, and 0.12 mm in a thickness direction. The LED chip has an n-type layer, an active layer, and a p-type layer of nitride semiconductor sequentially stacked on a sapphire substrate, and is capable of emitting blue light having a peak wavelength of 452 nm. The conductive members 60 are of gold-tin solder, for example, Au:Sn=79:21, which is 15 μm in thickness.

On the light emitting element 10, a wavelength converting member 20 and a light transmissive member 30 are adhered via an adhesive member 40. The wavelength converting member 20 is a cured piece of a phenyl silicone resin base material 21 of 1.16 mm in the longitudinal direction, 0.22 mm in the lateral direction, and 0.12 mm in the thickness direction. The resin base material 21 contains, as the fluorescent substance 25, β-SiAlON-based phosphor and a potassium fluorosilicate-based phosphor, and, as a filler, silica nanoparticles. The lateral surfaces of the wavelength converting member 20 have irregularities. The light transmissive member 30 is a cured piece of a phenyl silicone resin of 1.16 mm in the longitudinal direction, 0.22 mm in the lateral direction, and 0.04 mm in the thickness direction.

The lateral surfaces of the light transmissive member 30 are smoother than the lateral surfaces of the wavelength converting member 20. The adhesive member 40 is a cured dimethyl silicone resin of 5 μm in thickness. The adhesive member 40 covers some portions of the lateral surfaces of the light emitting element 10 and some portions of the lateral surfaces of the wavelength converting member 20. The lateral surfaces of the adhesive member 40 are smoother than the lateral surfaces of the wavelength converting member 20.

The light reflective member 50 of 1.35 mm in a longitudinal dimension and 0.32 mm in a lateral dimension is a cured piece of a phenyl silicone resin base material 51, which contains 60 wt % of titanium oxide as a white pigment 55. The light reflective member 50 covers the lateral surfaces of the light emitting element 10 directly and via the adhesive member 40. The light reflective member 50 covers the lateral surfaces of the wavelength converting member 20 via the adhesive member 40. The upper surface of the light reflective member 50 and the upper surface of the light transmissive member 30 are coplanar. The end surfaces of the light reflective member 50 facing in the transverse direction are coplanar with the end surfaces of the wiring board 70 facing in the transverse direction, and one of the end surfaces becomes the mounting surface of the light emitting device. The light reflective member 50 makes the upper surface of the light transmissive member 30 the effective emission area of the light emitting device.

The light emitting device of Example 1 described above can be produced as follows. First, the wavelength converting member 20 and the light transmissive member 30 are prepared by adhering together a thin sheet 920 of the resin which contains the fluorescent substances and a thin sheet 930 of the resin which contains effectively no fluorescent substance, and cutting the stack into pieces to the size described above. Here, the thin sheet 920 of the resin which contains the fluorescent substances and the thin sheet 930 of the resin which contains effectively no fluorescent substance are respectively a phosphor sheet and a transparent sheet of B-stage cured resins.

Next, on the composite boards 701, plural pieces of light emitting elements 10, arranged in the transverse direction, are flip chip mounted. Here, the composite boards 701 have a group of substrates areas formed of a plurality of wiring boards 70 arranged in the transverse direction distanced by transversely extending slits arranged in the lateral direction. The light emitting elements 10 are mounted by applying an eutectic gold-tin solder paste of which the conductive members 60 is formed, on the element mounting portions 75a of the composite boards 701, placing the light emitting elements 10 thereon, and melting and solidifying the eutectic gold-tin solder by the reflow process. Then, on the upper surface of each of the light emitting elements 10, the adhesive member 40 is applied, on which the wavelength converting member 20 having the light transmissive member 30 stacked thereon is placed and lightly pressed down to allow the adhesive member 40 to extend onto some portions of the lateral surfaces of the light emitting elements 10 and some portions of the lateral surfaces of the wavelength converting member 20. Subsequently, the resin comprising the adhesive member 40 is cured by heating. In the manner described above, the plurality of light emitting structures 15, each including the light emitting element 10, the adhesive member 40, the wavelength converting member 20, and the light transmissive member 30 in that order, are formed in a row in the vertical direction on the composite boards 701.

Next, a light reflective member 50 is formed on the composite boards 701 by transfer molding so that the plurality of light emitting structures 15 arranged in the transverse direction on a group of substrates areas are embedded in a parallelepiped light reflective member 50. Then, the light reflective member 50 is ground from the top to expose the upper surfaces of light transmissive members 30 using a grinder 99.

Figure 4E:
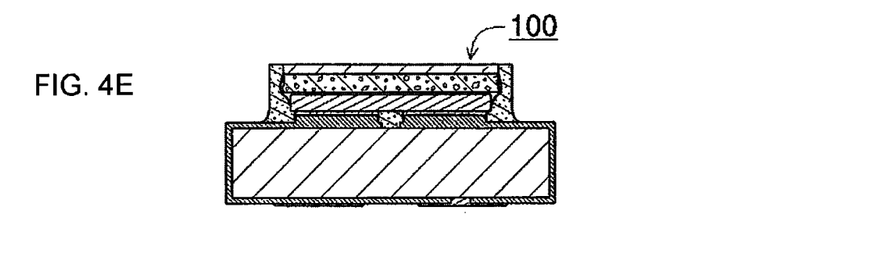

Finally, the light reflective member 50 and the composite boards 701 are cut in the transverse direction between the light emitting structures 15 to obtain the light emitting devices by dicing apparatus.

The light emitting device of Example 1 configured as above can have an effect of the light emitting device 100 according to Embodiment 1.

INDUSTRIAL APPLICATION

The light emitting device according to certain embodiments of the disclosure can be utilized in backlight devices for liquid crystal displays, various lighting equipment, large sized displays, various display devices for advertisements and destination signs, projectors, as well as image pickup devices in digital video cameras, facsimiles, copiers, scanners, and the like.

What is claimed is:

1. A light emitting device comprising:
   at least one light emitting element;
   a wavelength converting member having an upper surface and lateral surfaces, containing a fluorescent substance, and being placed on the at least one light emitting element;
   a light transmissive member being in contact with the upper surface of the wavelength converting member;
   an adhesive member interposed between the at least one light emitting element and the wavelength converting member, the adhesive member adhering an upper surface of the at least one light emitting element to a lower surface of the wavelength converting member and covering the lateral surfaces of the wavelength converting member; and
   a light reflective member covering the lateral surfaces of the wavelength converting member via the adhesive member,
   wherein the adhesive member covers at least a part of a lateral surface of the at least one light emitting element,
   wherein the light reflective member covers a lower surface of the at least one light emitting element,
   wherein in a sectional view, a width of the adhesive member on a same plane as a lower surface of the wavelength converting member is larger than a width of the adhesive member on a same plane as an upper surface of the wavelength converting member,
   wherein in a section view, the adhesive member has a first width at a highest position of the adhesive member, a second width at a lowest position of the adhesive member and a third width at a position between the highest position and the lowest position of the adhesive member, and the third width is larger than the first width and the second width,
   wherein whole lateral surfaces of the light transmissive member are directly connected with the light reflective member, and
   wherein in the sectional view, a minimum width of a portion of the light reflective member covering the adhesive member is smaller than a width of another portion of the light reflective member covering the light transmissive member.

2. The light emitting device according to claim 1, wherein the lateral surfaces of the wavelength converting member have irregularities.

3. The light emitting device according to claim 1, wherein the lateral surfaces of the light transmissive member are smoother than the lateral surfaces of the wavelength converting member.

4. The light emitting device according to claim 1, wherein the lateral surfaces of the adhesive member are smoother than the lateral surfaces of the wavelength converting member.

5. The light emitting device according to claim 1, wherein a plurality of light emitting elements are included, and
   a light diffusing member containing a light diffusion agent is included between the plurality of light emitting elements and the wavelength converting member.

6. The light emitting device according to claim 1, wherein the fluorescent substance includes at least one of a fluoride phosphor and quantum dots.

7. The light emitting device according to claim 1, wherein the wavelength converting member is a cured resin containing the fluorescent substance.

8. The light emitting device according to claim 1, wherein the light reflective member covers lateral surfaces of the at least one light emitting element.

9. The light emitting device according to claim 1, further comprising a wiring board, wherein the at least one light emitting element is flip chip mounted on the wiring board.

10. The light emitting device according to claim 1, wherein an upper surface of the light reflective member and an upper surface of the light transmissive member are coplanar.

11. The light emitting device according to claim 1, further comprising a wiring board, wherein
   a top view shape of the light emitting element is a rectangle having a longitudinal direction and a lateral direction,
   in the lateral direction, a width of the light reflective member is equal to a width of the wiring board, and
   in the longitudinal direction, a length of the light reflective member is smaller than a length of the wiring board.

12. The light emitting device according to claim 1, further comprising a wiring board having one or more element mounting portions including a protrusion, wherein
   an outer lateral surface of the light reflective member includes a curved portion, the curved portion being located laterally from the element mounting portions as well as being adjacent to an upper surface of the wiring board, and wherein in a sectional view, the curved portion has a concave shape with a lower edge extending outwardly.

13. The light emitting device according to claim 1, wherein a mounting surface of the light emitting device is substantially perpendicular to an upper surface of the light transmissive member.

14. The light emitting device according to claim 13, wherein the top view shape of the light emitting device is a quadrangle of each side being 0.5 mm or smaller.

* * * * *